(12) United States Patent
Gu

(10) Patent No.: US 6,641,409 B1
(45) Date of Patent: Nov. 4, 2003

(54) GROUNDING STRUCTURE FOR NETWORK CARD

(76) Inventor: Yin Tsair Gu, No. 90, Yungshin Rd., Hsin Tien, Taipei Hsien (TW)

( * ) Notice: Subject to any disclaimer, the term of this patent is extended or adjusted under 35 U.S.C. 154(b) by 0 days.

(21) Appl. No.: 10/162,649

(22) Filed: Jun. 6, 2002

(51) Int. Cl.[7] .............................................. H01R 12/00
(52) U.S. Cl. ...................... 439/76.1; 439/607; 439/946; 361/737
(58) Field of Search ................................ 439/76.1, 946, 439/95, 607; 361/737

(56) References Cited

U.S. PATENT DOCUMENTS

| | | | | |
|---|---|---|---|---|
| 5,833,473 A | * | 11/1998 | Betker et al. | 439/76.1 |
| 5,896,274 A | * | 4/1999 | Ishida | 361/737 |
| 6,004,144 A | * | 12/1999 | Yeh et al. | 439/76.1 |
| 6,330,163 B1 | * | 12/2001 | Bates et al. | 361/737 |
| 6,474,998 B1 | * | 11/2002 | Takeuchi | 439/76.1 |

* cited by examiner

Primary Examiner—Tho D. Ta
(74) Attorney, Agent, or Firm—Bacon & Thomas, PLLC

(57) ABSTRACT

A grounding structure for network card, particularly the network card for notebook computers, mainly includes a grounding member connected to a top of a connector of the network card. The grounding member is provided at an edge with a plurality of pins for welding to or contacting with a circuit board of the network card. The grounding member has an upper grounding plane that is exposed from a front edge of an upper case of the network card to flush with a top of the upper case. A plurality of conductive dots are equally spaced on the grounding plane for the grounding member to function as a grounding conductor and thereby protect electronic elements on the circuit board against burning out.

3 Claims, 3 Drawing Sheets

GROUNDING STRUCTURE FOR NETWORK CARD

FIELD OF THE INVENTION

The present invention relates to a grounding structure for a network card. The grounding structure includes a grounding member that has one side welded to or directly contacted with a circuit board of the network card and an upper grounding plane exposed from the network card, so that the network card has a grounding conductor to protect electronic elements on the circuit board against burning out.

BACKGROUND OF THE INVENTION

Many smart electronic apparatus, such as computers and various peripherals thereof, are widely employed in different fields. Operators of these electronic apparatus tend to be in a highly static electrification state due to the dry or carpeted environments in which the electronic apparatus are set up, or due to their clothing. Once the electrified operators are in contact with the electronic apparatus, static electricity is discharged from the operators to the electronic apparatus to cause damaged or even short-circuited and burned-out internal electronic elements and, accordingly, failed electronic apparatus.

To protect the electronic apparatus against damages caused by the static electricity discharged from the operators, it is a common practice to ground an internal circuit board via a case or housing of the electronic apparatus, in order to protect the electronic elements provided on the circuit board and maintain normal operation of the electronic apparatus. A network card is widely used with local area networks. Just as the above-mentioned electronic apparatus, the network card must also be provided with structure for shielding high static electricity without exception. In a currently available skill for protecting internal electronic elements, such as integrated circuits, of an ultra-thin type network card against high static electricity, a lower case of the network card is formed at two opposite longitudinal edges with two upward extended walls, which are inward bent to press against a grounding conductive pad on a circuit board of the network card, so that the circuit board is firmly sandwiched between the pad and an upper surface of the lower case. An upper case of the network card is then closed onto the lower case for the entire network card to be a grounded conductor.

Although the above-described structure facilitates discharge of static electricity to provide the function of grounding, it has the following drawback.

The upward extended walls integrally formed at two longitudinal edges of the lower case are of the same material and in the same thin-sheet form as the lower case. When these extended thin walls are repeatedly bent during necessary repairs of electronic elements of the network card, they will finally break and must be removed and replaced with a new one, resulting in loss of metal material and increased cost, and even loss of the grounding function thereof.

It is therefore tried by the inventor to develop an improved grounding structure for a network card to eliminate the above-mentioned drawbacks.

SUMMARY OF THE INVENTION

A primary object of the present invention is to provide a network interface card for notebook computers, which enables grounding of electronic elements inside the network card to discharge static electricity from the network card, and therefore ensures normal operation of the internal electronic elements thereof.

Another object of the present invention is to provide a grounding structure for a network card, which can be quickly assembled and disassembled without causing damages to cases or components of the network card.

To achieve the above and other objects, the present invention includes a grounding member connected to a top of a connector of the network card. The grounding member is provided at an edge with a plurality of pins for welding to or contacting with a circuit board of the network card. The grounding member has an upper grounding plane that is exposed from and flush with a front end of the upper case of the network card, and is provided with equally spaced conductive dots. With the grounding member that provides grounding function, electronic elements inside the network card are protected against burning-out.

The grounding member is provided at two lateral ends with two vertically downward extended lugs that engage with two vertical slots provided at two lateral ends of the connector to firmly connect the grounding member to the top of the connector. To enable a firm connection of the grounding member to the top of the connector, the two lugs at the two lateral ends of the grounding member are further provided at their respective outer vertical surfaces with two outward and upward inclined elastic lips, which automatically press against inner walls of the slots on the connector when the lugs are engaged with the slots.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
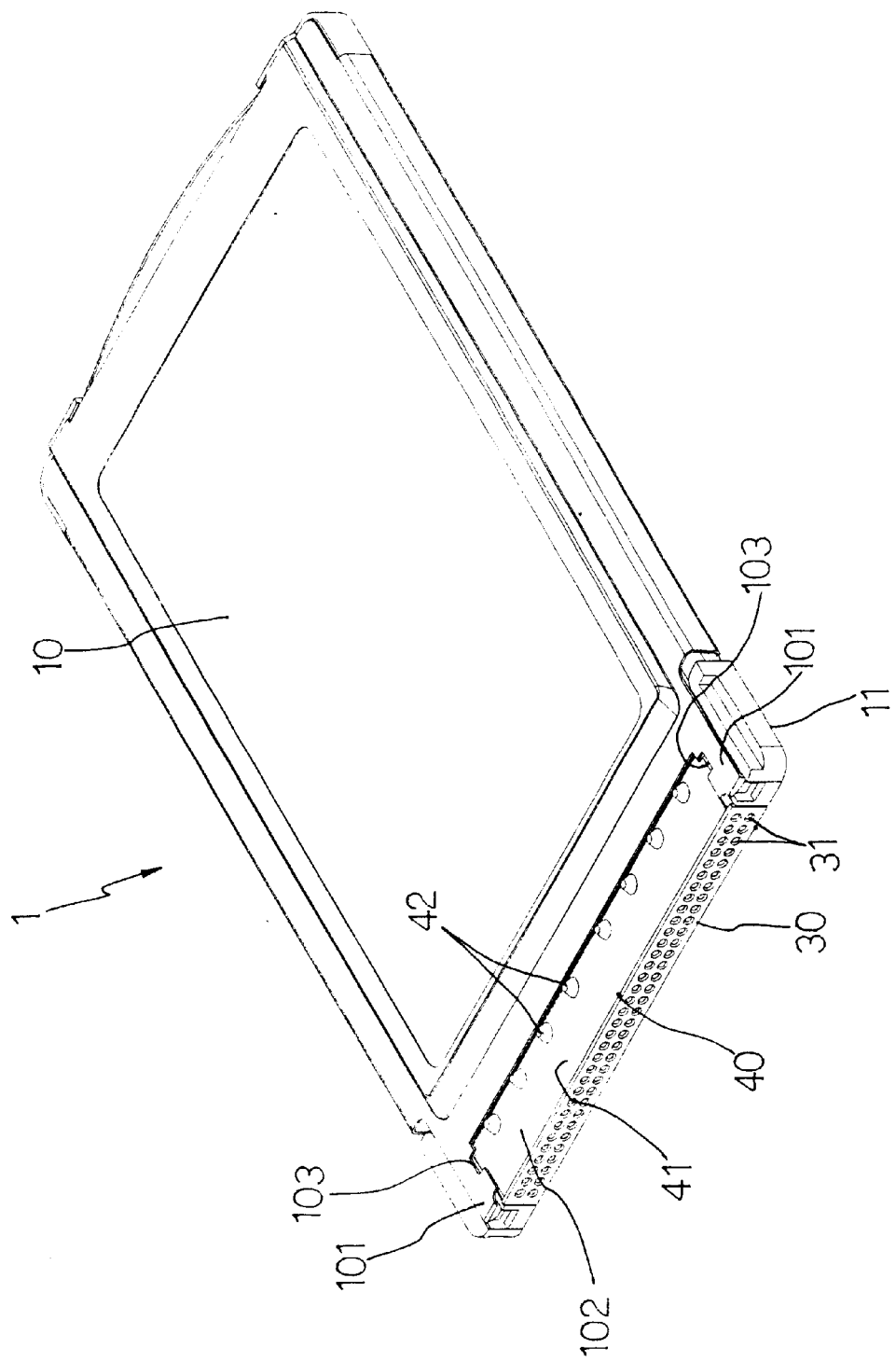
FIG. 1 is an assembled perspective view of a network card incorporating a grounding structure of the present invention.
Figure 2:
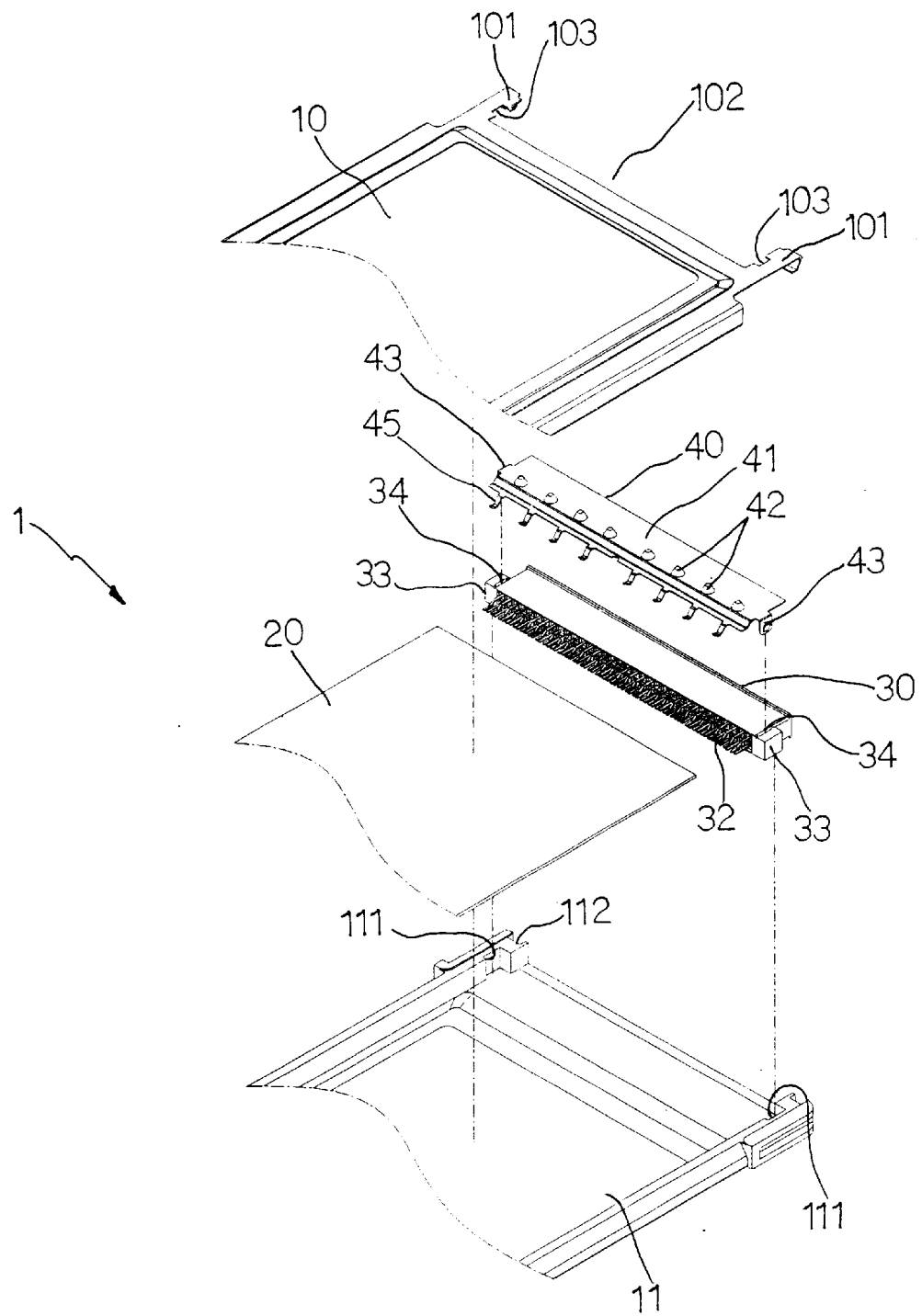
FIG. 2 is a fragmentary exploded perspective view of FIG. 1.

Please refer to FIGS. 1 and 2 that are assembled and fragmentary exploded perspective views, respectively, of a network card 1 incorporating a grounding structure of the present invention.

As shown, the network card 1 mainly includes an upper case 10, a lower case 11, a circuit board 20 mounted between the upper and the lower cases 10, 11, a connector 30 welded to a front edge of the circuit board 20, and a grounding member 40 connected to a top of the connector 30. The grounding member 40 has an upper surface that serves as a grounding plane 41 and is exposed from the upper case 10 of the network card 1 and flush with a surface of the upper case 10. The grounding plane 41 of the grounding member 40 is provided at predetermined positions with a plurality of equally spaced and upward protruded conductive dots 42. With the grounding member 40 that has the function of a grounding conductor, electronic elements on the circuit board 20 are well protected against burning out.

The upper case 10 of the network card 1 is provided at two front corner with two forward extended retaining arms 101, which together with a front edge of the upper case 10 to form a generally U-shaped frame defining a forward opened space 102. The two retaining arms 101 constitute two short lateral sides of the U-shaped frame and are provided at respective inner, longitudinal edges with a laterally inward opened notch 103 each.

The lower case 11 is provided at inner wall surfaces near two front corners with two laterally inward opened sockets 111, and at the two front corners with two catches 112 corresponding to the retaining arms 101 of the upper case 10.

The connector 30 is an elongated member, and is provided at a front surface with upper and lower rows of equally spaced pin holes 31 and at an opposite rear surface with equally spaced pins 32 for welding to the front edge of the circuit board 20. Areas on two lateral end surfaces of the connector 30 adjacent to the rear surface with pins 32 are provided with two laterally outward projected retaining blocks 33 for correspondingly engaging with the sockets 111 on the lower case 11 and thereby locate the connector 30 in place on the lower case 11. The two retaining blocks 33 are provided at top surfaces with two vertically extended slots 34.

The grounding member 40 is an elongated flat member located above the connector 30 and is provided at two lateral ends with two vertically downward extended lugs 43, which are engaged with the slots 34 on the retaining blocks 33 of the connector 30 to fixedly connect the grounding member 40 to a top of the connector 30.

Figure 3:
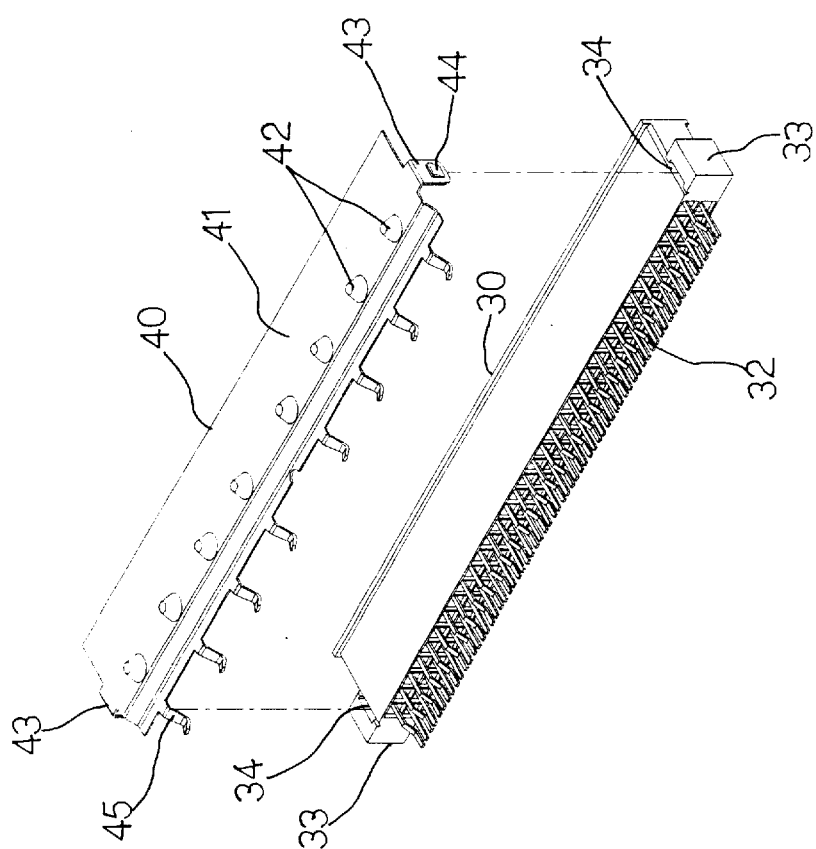
FIG. 3 is an enlarged exploded perspective view showing the connection of a grounding member to a connector included in the network card incorporating the grounding structure of the present invention.

Please refer to FIG. 3. To enable a firm connection of the grounding member 40 to the top of the connector 30, the two lugs 43 at the two lateral ends of the grounding member 40 are further provided at their outer vertical surface with two outward and upward inclined elastic tabs 44. When the lugs 43 are engaged with the slots 34, the elastic tabs 44 automatically press against inner walls of the slots 34 to ensure tight connection of the grounding member 40 to the top of the connector 30.

The grounding member 40 is further provided at an edge adjacent to the front edge of the circuit board 20 with a plurality of bent pins 45 for welding to or contacting with the circuit board 20.

When the upper case 10 is secured to the lower case 11 by engaging the two retaining arms 101 of the upper case 10 with the two catches 112 of the lower case 11, the forward opened space 102 defined in front of the front edge of the upper case 10 and the two laterally inward opened notches 103 on inner edges of the retaining arms 101 allow the grounding plane 41 of the grounding member 40 to be exposed from and flush with a top of the upper case 10. The equally spaced conductive dots 42 protruded from the top of the grounding plane 41 enable the grounding.

With the above arrangements, the network card 1 with the grounding structure of the present invention may be quickly assembled for use and disassembled for repair and maintenance.

The present invention has been described with a preferred embodiment thereof and it is understood that many changes and modifications in the described embodiment can be carried out without departing from the scope and the spirit of the invention as defined by the appended claims.

What is claimed is:

1. A grounding structure for a network card, comprising a network card and a grounding member;

said network card including an upper case, a lower case, a circuit board mounted between said upper and lower cases, and a connector welded to a front edge of said circuit board;

said upper case being provided at two front corners with two forwardly extending retaining arms, which together with a front edge of said upper case form a generally U-shaped frame defining a forward opened space;

said lower case being provided at inner wall surfaces near two front corners with two laterally inward opened sockets, and at said two front corners with two catches for engaging with said retaining arms of said upper case, so that said upper case is closed onto said lower case; and said connector being an elongated member and being provided at two lateral ends with two laterally outward projected retaining blocks for engaging with said sockets on said lower case and thereby locating said connector in place on said lower case, and said two retaining blocks being provided on respective top surfaces with two vertically extended slots; and said grounding member being provided at two lateral ends with two vertically downward extended lugs for engaging with said slots on said retaining blocks of said connector to fixedly connect said grounding member to a top of said connector, at an edge adjacent to the front edge of said circuit board with a plurality of bent pins for welding to or contacting with said circuit board, and at an upper surface that is adjacent to said bent pins and serves as a grounding plane with a plurality of equally spaced and upward protruded conductive dots for said grounding member to function as a grounding conductor;

whereby when said upper case is closed onto said lower case, said forward opened space defined at a front end of the said upper case allows said grounding plane of said grounding member to be exposed from and flush with a top of said upper case to provide the function of a grounding conductor and accordingly protect electronic elements on said circuit board against burning out, and whereby said network card could be quickly assembled for use and disassembled for repair and maintenance without causing damages to components thereof.

2. The grounding structure for a network card as claimed in claim 1, wherein said two retaining arms of said upper case constitute two short lateral sides of said U-shaped frame and are provided at respective inner longitudinal edges with two laterally inward opened notches, with which said two vertically downward extended lugs provided at two lateral ends of said grounding member are engaged to secure said upper case to said lower case.

3. The grounding structure for a network card as claimed in claim 1, wherein said two lugs at two lateral ends of said grounding member are provided at respective outer vertical surfaces with two outward and upward inclined elastic tabs, which automatically press against inner walls of said slots provided at two lateral ends of said connector when said lugs are engaged with said slots, so as to ensure tight connection of said grounding member to the top of said connector.

* * * * *